United States Patent [19]
Tsukamoto

[11] Patent Number: 5,723,356
[45] Date of Patent: Mar. 3, 1998

[54] FABRICATION METHOD FOR SEMICONDUCTOR DEVICE

[75] Inventor: Masanori Tsukamoto, Kanagawa, Japan

[73] Assignee: Sony Corporation, Japan

[21] Appl. No.: 688,117

[22] Filed: Jul. 29, 1996

[30] Foreign Application Priority Data

Aug. 7, 1995 [JP] Japan ................................ 7-200681

[51] Int. Cl.⁶ .................................................. H01L 21/70
[52] U.S. Cl. .................................. 437/57; 437/34; 437/46
[58] Field of Search .................................. 437/34, 46, 56, 437/57, 58

[56] References Cited

U.S. PATENT DOCUMENTS

| | | | |
|---|---|---|---|
| 5,180,690 | 1/1993 | Czubatyj et al. | 437/233 |
| 5,459,101 | 10/1995 | Fujii et al. | 437/34 |

OTHER PUBLICATIONS

Fujii, Toyokazu, et al., "Dual (n+/p+) Polycide Gate Technology Using Si–rich WSix to Exterminate Lateral Dopant Diffusion", 1994 Symposium on VLSI Technology Digest of Technical Papers, pp. 117–118.

*Primary Examiner*—John Niebling
*Assistant Examiner*—Long Pham
*Attorney, Agent, or Firm*—Ronald P. Kananen

[57] ABSTRACT

A first Poly-Si film and an a-Si film are formed on a semiconductor base body at a first step, and phosphorus ions (N-type impurity) are implanted in the a-Si film at an NMOS forming region and boron ions (P-type impurity) are implanted in the a-Si film at a PMOS forming region at a second step. The a-Si film is crystallized to form a second Poly-Si film and at the same time the impurities are diffused in the second Poly-Si film thus obtained and the first Poly-Si film at a third step. After that, a $WSi_x$ film is formed on the second Poly-Si film at a fourth step, and an offset oxide film is formed on the $WSi_x$ film at a fifth step. With this method, it is possible to suppress mutual diffusion of impurities having conducting types different from each other and hence to fabricate a semiconductor device such as a CMOS, which is low in variations in threshold voltage and excellent in device characteristics.

8 Claims, 3 Drawing Sheets

FABRICATION METHOD FOR SEMICONDUCTOR DEVICE

BACKGROUND OF THE INVENTION

The present invention relates to a fabrication method for a semiconductor device including first and second semiconducting elements having conductive portions of conducting types different from each other wherein each of the conductive portions is of a stack structure having a polysilicon (Poly-Si) film and a metal or metal compound film, and particularly to a fabrication method for a semiconductor device, which is suitable for fabrication of MOS field effect transistors (MOSFETs).

A complementary MOS transistor (CMOS) including an N-channel MOSFET (NMOSFET) and a P-channel MOSFET (PMOSFET) is known as the semiconductor device of this type. The CMOS, having advantages of low power consumption and high speed, is extensively available for many LSI applications including memory and logic circuits. In these MOSFETs, the gate length becomes finer with the trend to high integration of LSIs. It is now known that a MOSFET having a gate length of 0.1 µm or less is operated at room temperature.

Incidentally, the related art PMOSFET has an $N^+$-type gate electrode just as in the NMOSFET by reasons of the simple process and also the high performance depending on the buried channel type. The buried channel type, however, is difficult to suppress the short channel effect since deep sub-micron generation, and thereby it is regarded advantageous to use a $p^+$-type (surface channel type) gate electrode for the PMOSFET.

In fabrication of a CMOS including an NMOSFET having an $N^+$-type gate electrode and a PMOSFET having a $P^+$-type gate electrode, that is, a CMOS in which gate electrodes having conducting types different from each other are formed on the same semiconducting substrate, ions of an N-type impurity such as arsenic (As) or phosphorus (P) are implanted in a gate electrode forming film such as a Poly-Si film at a region required to be of an $N^+$-type, and ions of a P-type impurity such as boron (B) or boron difluoride ($BF_2$) are implanted in the Poly-Si film at a region required to be of a $P^+$-type.

Referring to FIG. 5, when the gate electrode is of a W-polycide structure having a Poly-Si film 53 formed on a silicon (Si) substrate 50 and a tungsten silicide ($WSi_x$) film 54 formed on the Poly-Si film 53, the above-described ion implantation is performed after formation of the $WSi_x$ film 54 in the related art method. In this case, an N-type impurity such as phosphorus is heavily doped in the $WSi_x$ film 54 at an NMOSFET forming region 55, while a P-type impurity such as boron is heavily doped in the $WSi_x$ film 54 at a PMOSFET forming region 56. After that, phosphorus and boron thus doped are respectively diffused in the Poly-Si film 53 at the regions 55, 56 by high-temperature heat treatment such as annealing for activating impurities doped in a source region and a drain region (hereinafter, referred to as source/drain regions) (not shown) formed in the Si substrate 50.

In addition, a field oxide film 51 is previously formed in the Si substrate 50 shown in FIG. 5 so as to surround the NMOSFET forming region 55 and the PMOSFET forming region 56, and a gate oxide film 52 is formed on the surface of the Si substrate 50 at the regions 55, 56.

The related art method, however, is disadvantageous as follows: namely, for a gate electrode of a stacked structure (polycide structure) having a Poly-Si film and a metal silicide film such as a $WSi_x$ film or of a stacked structure of a Poly-Si film and a metal film, an N-type impurity and a P-type impurity heavily distributed at gate electrode forming regions are mutually diffused by high-temperature heat treatment after ion implantation because the diffusion rate of each of the N-type and P-type impurities in the metal film or metal silicide film is very higher than in silicon oxide ($SiO_2$) or Si (by about four figures in diffusion coefficient).

For example, for the gate electrode of a W-polycide structure shown in FIG. 5, phosphorus as the N-type impurity is diffused toward the Poly-Si film 53 side of the P-type gate electrode forming portion through the $WSi_x$ film 54 in the direction shown by the arrow A, while boron as the P-type impurity is diffused toward the Poly-Si film 53 side of the N-type gate electrode forming portion in the direction shown by the arrow B. As a result, boron doped in the P-type gate electrode forming portion is compensated for phosphorus doped in the N-type gate electrode forming portion.

In the above-described polycide structure, even if impurities having conducting types different from each other are heavily doped in the Poly-Si film 53 (in place of the $WSi_x$ film 54) on the surface layer side, the doped impurities are shifted into the $WSi_x$ film 54 and mutually diffused as described above by high-temperature heat treatment after ion implantation.

Such a phenomenon is disadvantageous in that the concentration of each impurity in the Poly-Si film of the gate electrode is lowered, to vary the Fermi level of the Poly-Si film or to deplete the gate electrode upon application of a gate voltage, thereby varying the threshold voltage (Vth), resulting in the reduced device characteristics of the MOSFET.

Recently, a technology for reducing a diffusion rate of an impurity in a $WSi_x$ film using a Si-rich $WSi_x$ film is disclosed, wherein the Si-rich $WSi_x$ film is used to disorder the chain structure of W for exterminating the diffusion path for an impurity [T. Fujii, et. al., "Dual ($n^+/p^+$) Polycide Gate Technology using Si-Rich $WSi_x$ to Exterminate Lateral Dopant Diffusion" in VLSI Symp. Tech. Dig., p.117, (1994)]. The excessively increased Si content, however, is inconvenient in increasing a resistance of the $WSi_x$ film, causing an increase in interconnection resistance, delay of circuit operation and the like.

SUMMARY OF THE INVENTION

An object of the present invention is to provide a fabrication method for a semiconductor device of a type including first and second semiconducting elements having conductive portions of conducting types different from each other wherein each of the conductive portions is of a stacked structure having a polysilicon film and a metal or metal compound film, which is capable of fabricating a semiconductor device being low in variations in threshold voltage and excellent in device characteristics by suppressing mutual diffusion of impurities having conducting types different from each other.

To achieve the above object, according to a first aspect of the present invention, there is provided a fabrication method for a semiconductor device including a semiconductor base body; and a first semiconducting element having a first conductive portion of a first conducting type and a second semiconducting element having a second conductive portion of a second conducting type, which are formed on the semiconductor base body; wherein each of the conductive portions of the first and second semiconducting elements is composed of a polysilicon film, and a metal film or a metal compound film formed on the polysilicon film, the method including: a first step of forming an amorphous silicon film on the semiconductor base body; a second step of implanting ions of an impurity having the first conducting type in the amorphous silicon film at a region on which the first semiconducting element is to be formed, and implanting ions of an impurity having the second conducting type in the amorphous silicon film at a region on which the second semiconducting element is to be formed; a third step of crystallizing the amorphous silicon film to form the polysilicon film and at the same time diffusing the impurities in the polysilicon film, by heat treatment; a fourth step of forming a metal or metal compound film on the polysilicon film; and a fifth step of forming an insulating film on the metal or metal compound film.

The invention having the above configuration is advantageous as follows:

Since each impurity is diffused in the whole of a polysilicon film before formation of a metal or metal compound film, the metal or metal compound film is naturally free of the above diffusion. Moreover, upon the subsequent heat treatment for forming a semiconductor device, for example, upon heat treatment for activating impurities in source/drain regions in a MOSFET, each impurity is less diffused in the metal or metal compound film compared with the related art method because the impurity is already diffused in the whole of the polysilicon film and is not heavily distributed in the polysilicon film on the surface layer side.

Since a polysilicon film having a crystal grain size smaller than that of a polysilicon film formed by usual CVD, that is, having less crystal boundaries is formed by crystallization of an amorphous silicon film, it is possible to prevent each impurity having a conducting type from being diffused into the polysilicon film at a region having a conducting type different from that of the impurity by way of a metal or metal compound film. An insulating film deposited on the metal or metal compound film also prevents impurities from being introduced in the metal or metal compound film upon the subsequent ion implantation for forming source/drain regions.

Accordingly, it is possible to suppress the mutual diffusion of impurities having conducting types different from each other and hence to obtain conductive portions such as gate electrodes in which the impurities are heavily doped in the polysilicon film. The invention having the above configuration, therefore, is effective to prevent variations in the Fermi level in a polysilicon film and depletion of a gate electrode upon application of a gate voltage resulting from the above mutual diffusion, and hence to fabricate a semiconductor device such as a MOSFET being low in variations in threshold voltage and excellent in device characteristics.

According to a second aspect of the present invention, there is provided a fabrication method for a semiconductor device including a semiconductor base body; and a first semiconducting element having a first conductive portion of a first conducting type and a second semiconducting element having a second conductive portion of a second conducting type, which are formed on the semiconductor base body; wherein each of the conductive portions of the first and second semiconducting elements is composed of a first polysilicon film, a second polysilicon film formed on the first polysilicon film, and a metal film or a metal compound film formed on the second polysilicon film, the method including: a first step of forming the first polysilicon film and an amorphous silicon film in such a manner as to be stacked on the semiconductor base body in this order; a second step of implanting ions of an impurity having the first conducting type in the amorphous silicon at a region on which the first semiconducting element is to be formed, and implanting ions of an impurity having the second conducting type in the amorphous silicon at a region on which the second semiconducting element is to be formed; a third step of crystallizing the amorphous silicon film to form the second polysilicon film and at the same time diffusing the impurities in the second polysilicon film and the first polysilicon film, by heat treatment; a fourth step of forming a metal or metal compound film on the second polysilicon film; and a fifth step of forming an insulating film on the metal or metal compound film.

The invention having the above configuration exhibits the same effect as that of the previous configuration of the invention because a metal or metal compound film is formed after crystallization of an amorphous silicon film and diffusion of each impurity in the amorphous silicon film and then an insulating film is formed on the metal or metal compound film. Additionally, the invention having the above configuration has a feature that a first polysilicon film and the amorphous silicon film are stacked on a semiconductor base body in this order. Consequently, when a gate oxide film is formed on the surface of the semiconductor base body in a MOSFET, the first polysilicon film is positioned on the gate oxide film. The first polysilicon film is made of crystals having a crystal grain size smaller than that of a second polysilicon film obtained by crystallization of the amorphous silicon film. The invention having the above configuration, therefore, is effective to obtain a MOSFET excellent in reliability of a gate oxide film.

DETAILED DESCRIPTION OF THE PREFERRED EMBODIMENTS

The present invention will be described by way of example with reference to the accompanying drawings.

FIGS. 1A to 1E are views illustrating a first example, in which the present invention is applied to fabrication of a CMOS including an NMOSFET and a PMOSFET.

Figure 1A:
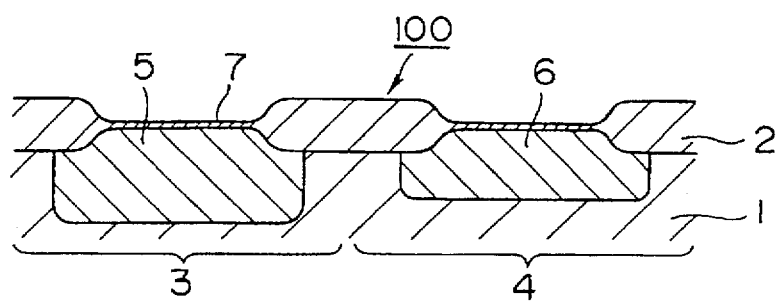
FIGS. 1A to 1E are sectional side views of an essential portion of a semiconductor device showing a processing sequence of a first example of a fabrication method according to the present invention.

In fabrication of a CMOS according to this example, a semiconductor base body 100 shown in FIG. 1A is first formed.

Specifically, a field oxide film 2 is formed on a Si substrate 1 by a LOCOS (Localized Oxidation of Silicon) process, for example, wet oxidation at 950° C. in such a manner as to surround a region 3 on which an NMOSFET as a first semiconducting element of the present invention is to be formed (hereinafter, referred to as "NMOS forming region") and a region 4 on which a PMOSFET as a second semiconducting element of the present invention is to be formed (hereinafter, referred to as "PMOS forming region").

An NMOS channel region 5 is formed in the Si substrate 1 at the NMOS forming region 3 by ion implantation for forming a P-well region, ion implantation for forming a buried layer so as to prevent punch-through of a transistor, and ion implantation for adjusting a threshold value. Similarly, a PMOS channel region 6 is formed in the Si substrate 1 at the PMOS forming region 4 by ion implantation for forming an N-well region, ion implantation for forming a buried layer so as to prevent punch-through of a transistor, and ion implantation for adjusting a threshold value.

A gate oxide film 7 is formed on the surface of the Si substrate 1 at both the NMOS and PMOS forming regions 3, 4 to a thickness of about 8 nm by pyrogenic oxidation performed at 850° C. using hydrogen and oxygen.

Figure 1B:
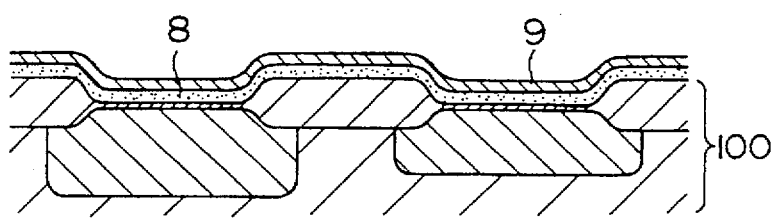

Next, as shown in FIG. 1B, a first polycrystalline silicon (Poly-Si) film 8 is deposited over the surface of the semiconductor base body 100 thus obtained by CVD (Chemical Vapor Deposition) performed at a deposition temperature of 580° C. or more, and then an amorphous silicon (a-Si) film 9 is deposited on the first Poly-Si film 8 by CVD performed at a deposition temperature of 580° C. or less (first step). In this example, the first Poly-Si film 8 is deposited over the surface of the semiconductor base body 100 to a thickness of about 70 nm by Low Pressure CVD (LP-CVD) performed at 610° C. using silane ($SiH_4$) gas as a source gas, and then the a-Si film 9 is deposited on the first Poly-Si film 8 to a thickness of about 50 nm by LP-CVD performed at 550° C. using $SiH_4$ gas as a source gas.

Figure 1C:
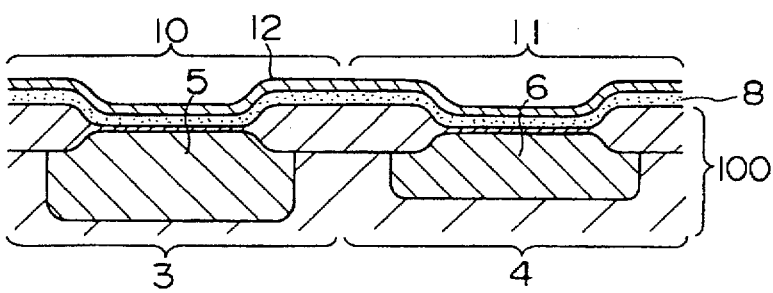

Subsequently, as shown in FIG. 1C, phosphorus ions ($P^+$) are implanted in the a-Si film 9 only at the NMOS forming region 3 at an ion energy of 10 KeV in a dose of $5 \times 10^{15}$ $cm^{-2}$ using as a mask a resist (not shown) patterned by lithography, to form an $N^+$-type gate region 10; while boron ions ($B^+$) are implanted in the a-Si film 9 only at the PMOS forming region 4 at an ion energy of 5 KeV in a dose of $5 \times 10^{15}$ $cm^{-2}$ using as a mask a resist (not shown) patterned by lithography, to form a $P^+$-type gate region 11 (second step).

The a-Si film 9 is subjected to heat treatment, for example, RTA (Rapid Thermal Anneal) at 1000° C. for 10 seconds, so that the a-Si film 9 is crystallized to form a second Poly-Si film 12 and at the same time each impurity in the a-Si film 9 on the surface layer side is diffused into the second Poly-Si film 12 thus obtained and into the previously formed first Poly-Si film 8 (third step). The second Poly-Si film 12 obtained by crystallization of the a-Si film 9 is made of crystals having a crystal grain size larger than that of the underlying first Poly-Si film 8 previously formed by CVD. This heat treatment also allows the crystallization of the a-Si film 9 and diffusion of the impurity in the a-Si film 9 to proceed simultaneously, and to diffuse the impurity in the whole of the second Poly-Si film 12 and the first Poly-Si film 8. Additionally, the heat treatment activates the previously formed NMOS and PMOS channel regions 5, 6.

Figure 1D:
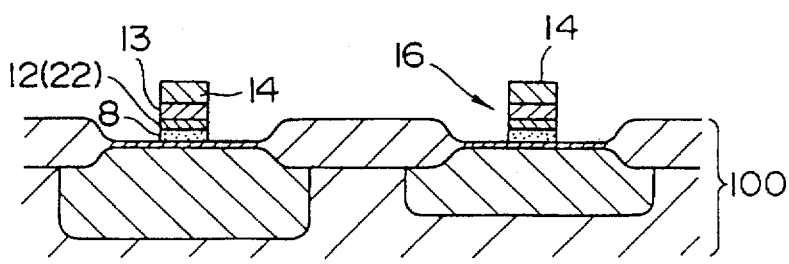

Next, as shown in FIG. 1D, a $WSi_x$ film 13 as a metal compound film of the present invention is deposited on the second Poly-Si film 12 to a thickness of about 70 nm by LP-CVD performed at 380° C. using tungsten hexafluoride ($WF_6$) gas and $SiH_4$ gas as a source gas (fourth step). A $SiO_2$ film (offset oxide film) 14 as an insulating film of the present invention is deposited on the $WSi_x$ film 13 to a thickness of about 150 nm by CVD performed at 420° C. using $SiH_4$ gas and oxygen gas (fifth step). Thus, a W-polycide layer composed of the first Poly-Si film 8, the second Poly-Si film 12 and the $WSi_x$ film 13 is formed in such a manner as to be covered with the offset oxide film 14.

The above polycide layer is subjected to anisotropic etching using as a mask a resist pattern by lithography, to form a pattern of a gate electrode 16 as a conductive portion of the present invention. The above anisotropic etching is performed using a fluorocarbon based etching gas for the offset oxide film 14 and using a mixed etching gas of a chlorine gas and oxygen gas for the W-polycide layer.

Figure 1E:
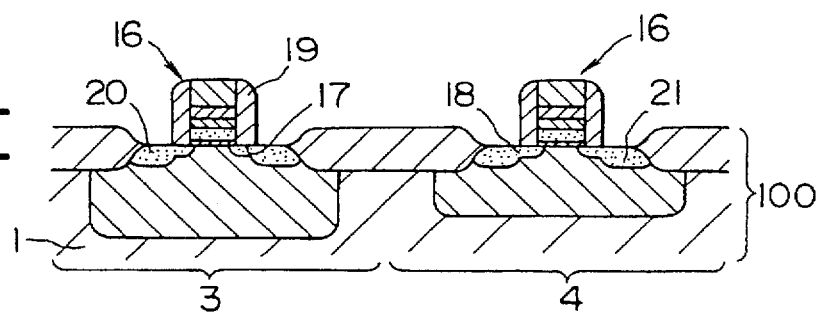

After that, arsenic ions ($As^+$) are implanted in the Si substrate 1 of the semiconductor base body 100 at the NMOS forming region 3 at an ion energy of 20 KeV in a dose of $5 \times 10^{13}$ $cm^{-2}$, to form N-type LDD (lightly Doped Drain) regions 17 on both sides of the gate electrode 16 of the Si substrate 1 at the region 3 as shown in FIG. 1E. On the other hand, boron difluoride ions ($BF_2^+$) are implanted in the Si substrate 1 at the PMOS forming region 4 at an ion energy of 20 KeV in a dose of $2 \times 10^{13}$ $cm^{-2}$, to form P-type LDD regions 18 on both sides of the gate electrode 16 of the Si substrate 1 at the region 4 as shown in FIG. 1E.

A $SiO_2$ film is deposited over the surface of the semiconductor base body 100 to a thickness of about 150 nm by LP-CVD so as to cover the gate electrode 16, and then the $SiO_2$ film is etched-back by anisotropic etching, to form a side wall 19 on the side wall of the gate electrode 16.

Next, arsenic ions are implanted in the Si substrate 1 at the NMOS forming region 3 at an ion energy of 20 KeV in a dose of $3 \times 10^{15}$ $cm^{-2}$, to form an N-type source/drain region 20 in the Si substrate at the region 3. On the other hand, boron difluoride ions are implanted in the Si substrate 1 at the PMOS forming region 4 at an ion energy of 20 KeV in a dose of $3 \times 10^{15}$ $cm^{-2}$, to form a P-type source/drain region 21 in the Si substrate 1 at the region 4.

The source/drain regions 20, 21 are subjected to RTA at 1000° C. for 10 seconds, to activate the impurities doped in the source/drain regions 20, 21.

The CMOS is thus obtained.

In the above fabrication method, since phosphorus or boron is diffused in the whole of the second Poly-Si film 12 and the first Poly-Si film 8 before formation of the $WSi_x$ film 8, the $WSi_x$ film 13 is free of the above diffusion of phosphorus or boron. Moreover, upon the subsequent heat treatment for activating impurities doped in the source/drain regions 20, 21, phosphorus or boron is less diffused in the $WSi_x$ film 13 compared with the related art method because phosphorus or boron is already diffused in the whole of the second Poly-Si film 12 and the first Poly-Si film 8 and is not heavily distributed in the second Poly-Si film 12 on the surface layer side.

Even if phosphorus is diffused from the $WSi_x$ film 13 to the second Poly-Si film 12 side of the $P^+$-type gate region 11 or boron is diffused from the $WSi_x$ film 13 to the second Poly-S film 12 side of the $N^+$-type gate region 10, boron and phosphorus are less compensated for each other compared with the case where each impurity is heavily distributed in the second Poly-Si film 12 on the surface layer side because the diffused amounts of phosphorus and boron are small as described above and phosphorus or boron is diffused in the whole of the second Poly-Si film 12 and the first Poly-Si film 8.

Since the second Poly-Si film 12 made of crystals having a crystal grain size larger than that of the first Poly-Si film 8 formed by usual CVD is formed, that is, the second Poly-Si film 12 having less crystal boundaries is formed by crystallization of the a-Si film 9 by heat treatment, it is possible to prevent phosphorus or boron from being diffused into the second Poly-Si film 12 and the first Poly-Si film 8 at a region having a conducting type different from that of phosphorus or boron by way of the $WSi_x$ film 13.

In this example, since ion implantation for forming the source/drain regions 20, 21 is performed after deposition of the offset oxide film 14 on the $WSi_x$ film 13, it is possible to prevent impurities from being introduced in the $WSi_x$ film 13 upon the ion implantation. This is also effective to reduce the amount of the impurity diffused in the $WSi_x$ film 13 upon the subsequent heat treatment.

Since the heat-treatment step for the a-Si film 9 is performed by RTA, it is possible to diffuse boron or phosphorus doped in the a-Si film 9 into crystals of the second Poly-Si film 12 and the first Poly-Si film 8 without precipitation of boron or phosphorus at crystal boundaries of the second Poly-Si film 12 obtained by crystallization of the a-Si film 9. This is effective to reduce the amount of phosphorus or boron diffused in the $WSi_x$ film 13 upon heat treatment.

Accordingly, in this example, the gate electrode 16 having the first Poly-Si film 8 and the second Poly-Si film 12 heavily doped with each of phosphorus and boron can be formed by suppressing mutual diffusion of phosphorus and boron. This makes it possible to prevent variations in the Fermi level in the first Poly-Si film 8 and the second Poly-Si film 12 and depletion of the gate electrode 16 upon application of the gate voltage resulting from the mutual diffusion of phosphorus and boron. Thus, there can be obtained a CMOS being low in variations in threshold voltage and excellent in MOSFET characteristics.

In this example, since the $WSi_x$ film 13 is used as a metal compound film, it is possible to form the gate electrode 16 having a low resistance without thinning such as self aligned silicidation.

Since boron is used as a P-type impurity, the increased diffusion rate of the impurity affected by fluorine can be suppressed as compared with the case using boron difluoride, to prevent an inconvenience such as punch-through of boron in the gate oxide film 7 due to the increased diffusion rate. Moreover, since the first Poly-Si film 8 made of crystals having a small grain size is formed directly on the gate oxide film 7 by usual CVD performed at 580° C. or more, there can be fabricated a CMOS having the gate oxide film excellent in reliability.

While the gate electrode 16 is taken as the conductive portion of the present invention in this example, an interconnection layer may be taken as the conductive portion.

While the a-Si film 9 is formed on the semiconductor base body 100 through the first Poly-Si film 8 in this example, it may be directly formed on the semiconductor base body and is crystallized to form a Poly-Si film of the conductive portion. In this case, there can be obtained the same effect as that of the above example.

In addition, the $WSi_x$ film used as a metal compound film may be replaced with the other high melting point metal silicide film, and the above metal compound film may be replaced with a metal film.

In the above example, the crystallization of the a-Si film 9 and the diffusion of each impurity in the second Poly-Si film 12 and the first Poly-Si film 8 are simultaneously performed in one heat treatment (third step); however, the above heat treatment may be divided into a first heat treatment for crystallization and a second heat treatment for diffusion of the impurity.

Figure 2:
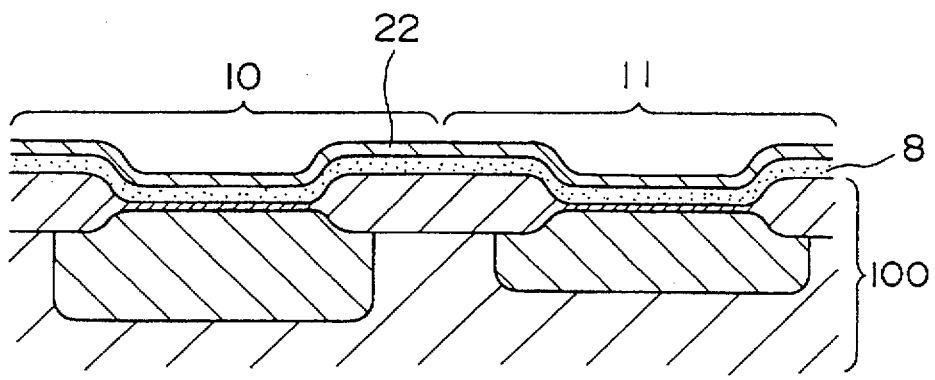
FIG. 2 is a sectional side view of an essential portion of a semiconductor device showing a second example of the fabrication method according to the present invention.

Hereinafter, a second example of the present invention will be described with reference to FIG. 2, in which the third step is divided into a first heat-treatment step and a second heat-treatment step.

In this example, the processing is performed in the same manner as in Example 1 until the second step, to form an $N^+$-type gate region 10 and a $P^+$-type gate region 11.

Next, in the first heat treatment in the third step, a low temperature annealing is performed at a temperature in a range of from 550° to 700° C. for 1–10 hours for crystallization of the a-Si film 9. In this example, the a-Si film 9 is grown in a solid state by annealing performed at 650° C. for 10 hours, to crystallize the a-Si film 9. The crystallization of the a-Si film 9 forms a second Poly-Si film 22 made of crystals having a crystal grain size larger than those of the underlaying first Poly-Si film 8 and the second Poly-Si film 12 obtained in Example 1.

When the temperature in the first heat treatment is lower than 550° C., the crystallization of the a-Si film is difficult, while when it is more than 700° C., the generation of nuclei is so fast that the a-Si film are not growth into crystals having a large grain size. On the other hand, when the processing time in the first heat treatment is less than one hour, the crystal growth is insufficient to obtain crystals having a large grain size, while when it is more than 10 hours, the crystal growth is saturated.

In the second heat treatment in the third step, RTA is performed for 10 seconds at a temperature higher than that in the first heat treatment, for example, 1000° C. for diffusing each impurity such as phosphorus or boron present on the surface layer side of the second Poly-Si film 22 having a large crystal grain size into the whole of the second Poly-Si film 22 and the first Poly-Si film 8.

After that, the processing is performed in accordance with the steps 1D and 1E in Example 1, to thus fabricate a CMOS.

The diffusion of an impurity generally requires a temperature more than 800° C.; however, it is known that an a-Si film is difficult to be grown into a sufficiently large crystals at this temperature. However, in the above fabrication method, the second heat treatment for diffusion of the impurity is performed after the first heat treatment for crystallization of the a-Si film 9, and thereby the a-Si film 9 can be crystallized into large crystals at an optimum temperature, 650° C., which is lower than that in the second heat treatment; and then the impurity such as phosphorus or boron can be sufficiently diffused in the whole of the second Poly-Si film 22 and the first poly-Si film 8 at the temperature higher than that in the first heat treatment. Moreover, since the second Poly-Si film made of crystals having a large crystal grain size is small in the number of crystal boundaries, it is possible to prevent phosphorus or boron from being diffused into the second Poly-Si film 22 and the first Poly-Si film 8 at the region having a conducting type different from that of phosphorus or boron by way of the $WSi_x$ film 13 upon the subsequent heat treatment for activating impurities in the source/drain regions 20, 21.

Figure 3:
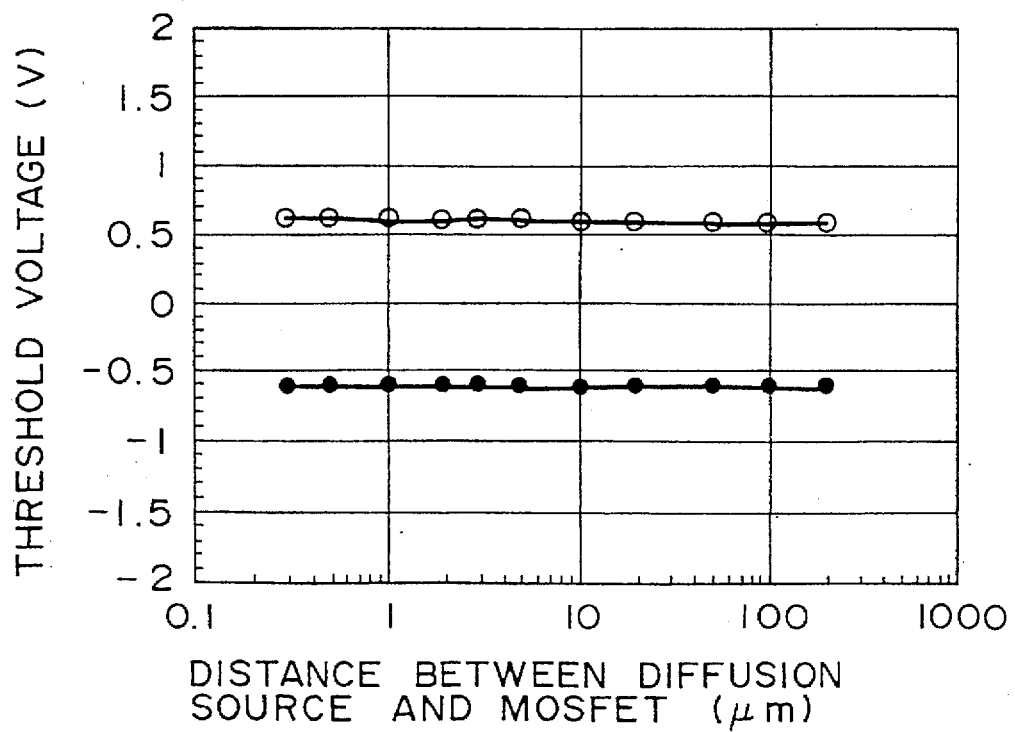
FIG. 3 is a graph showing results of measuring variations in threshold voltage of a CMOS formed by the fabrication method of the present invention.
Figure 4:
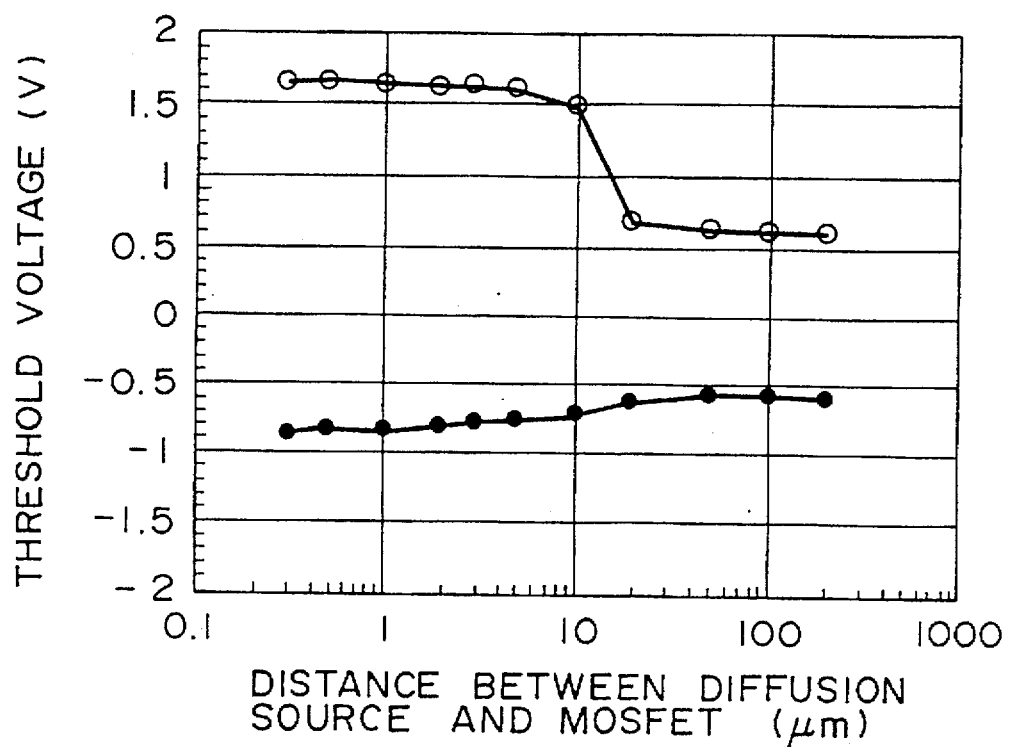
FIG. 4 is a graph showing results of measuring variations in threshold voltage of a CMOS formed by a related art fabrication method.
Figure 5:
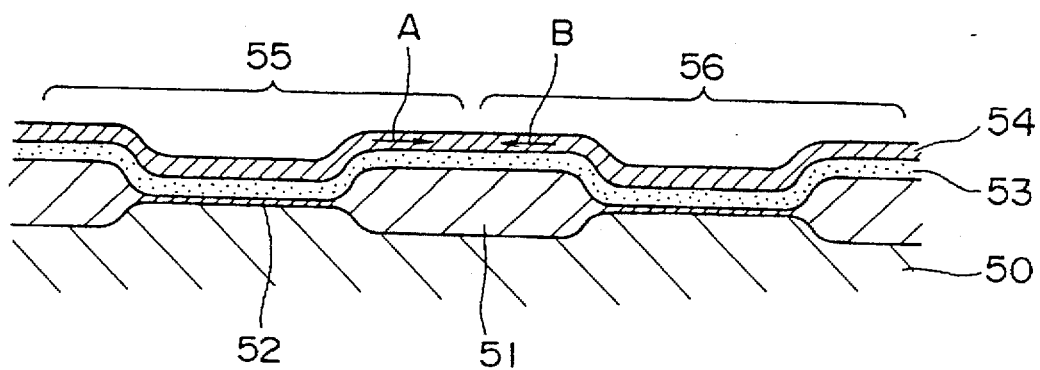
FIG. 5 is a sectional side view illustrating mutual diffusion of impurities upon formation of a CMOS by the related art fabrication method.

FIGS. 3, 4 show results of measuring variations in threshold voltage of an NMOSFET and PMOSFET in a test pattern in which a diffusion source is provided in a gate electrode of a CMOS, wherein FIG. 3 shows the case where an impurity is diffused in a Poly-Si film by the second heat treatment before deposition of a $WSi_x$ film according to the above example; and FIG. 4 shows the case where an impurity is diffused in a Poly-Si film by the heat treatment performed for forming source/drain regions according to the related art method.

In FIGS. 3, 4, the while circle ○ indicates a threshold voltage of the NMOSFET and the black circle ● indicates a threshold voltage of the PMOSFET. In addition, the ordinate indicates a threshold voltage (V); and the abscissa indicates a distance (μm) from a diffusion layer formed in the semiconductor base body of each of the NMOSFET and PMOSFET to the above diffusion source.

As seen from FIGS. 3, 4, each of the NMOSFET and PMOSFET of the CMOS obtained by the example is very small in variations in threshold voltage as compared with the CMOS obtained by the related art method.

According to the above example, it is possible to suppress the mutual diffusion of phosphorus and boron, and hence to fabricate a CMOS being low in variations in threshold voltage and excellent in MOSFET characteristics.

While the preferred form of the present invention has been described, it is to be understood that modifications will be apparent to those skilled in the art without departing from the spirit of the invention.

The scope of the invention, therefore, is to be determined solely by the following claims.

What is claimed is:

1. A fabrication method for a semiconductor device including a semiconductor base body; and a first semiconducting element having a first conductive portion of a first conducting type and a second semiconducting element having a second conductive portion of a second conducting type, which are formed on said semiconductor base body; wherein each of said first and second conductive portions of said first and second semiconducting elements is composed of a polysilicon film, and a metal film or a metal compound film formed on said polysilicon film, said method comprising:

a first step of forming an amorphous silicon film on said semiconductor base body;

a second step of implanting ions of an impurity having the first conducting type in said amorphous silicon film at a region on which said first semiconducting element is to be formed, and implanting ions of an impurity having the second conducting type in said amorphous silicon film at a region on which said second semiconducting element is to be formed;

a third step of crystallizing said amorphous silicon film to form said polysilicon film and at the same time diffusing said impurities in said polysilicon film, by heat treatment;

a fourth step of forming a metal or metal compound film on said polysilicon film; and a fifth step of forming an insulating film on said metal or metal compound film.

2. A fabrication method for a semiconductor device according to claim 1, wherein said third step comprises:

a first heat-treatment step of crystallizing said amorphous silicon film; and a second heat-treatment step of diffusing said impurities in said polysilicon film at a temperature higher than that in said first heat-treatment step.

3. A fabrication method for a semiconductor device according to claim 2, wherein said second heat-treatment step is performed by rapid thermal annealing.

4. A fabrication method for a semiconductor device according to claim 1, wherein said heat treatment in said third step is performed by rapid thermal annealing.

5. A fabrication method for a semiconductor device including a semiconductor base body; and a first semiconducting element having a first conductive portion of a first conducting type and a second semiconducting element having a second conductive portion of a second conducting type, which are formed on said semiconductor base body; wherein each of said first and second conductive portions of said first and second semiconducting elements is composed of a first polysilicon film, a second polysilicon film formed on said first polysilicon film, and a metal film or a metal compound film formed on said second polysilicon film, said method comprising:

a first step of forming said first polysilicon film and an amorphous silicon film respectively stacked on said semiconductor base body;

a second step of implanting ions of an impurity having the first conducting type in said amorphous silicon at a region on which said first semiconducting element is to be formed, and implanting ions of an impurity having the second conducting type in said amorphous silicon at a region on which said second semiconducting element is to be formed;

a third step of crystallizing said amorphous silicon film to form said second polysilicon film and at the same time diffusing said impurities in said second polysilicon film and said first polysilicon film, by heat treatment;

a fourth step of forming a metal or metal compound film on said second polysilicon film; and a fifth step of forming an insulating film on said metal or metal compound film.

6. A fabrication method for a semiconductor device according to claim 5, wherein said third step comprises:

a first heat-treatment step of crystallizing said amorphous silicon film such that a crystal grain thereof is larger than that of said first polysilicon silicon film, to form said second polysilicon film; and a second heat-treatment step of diffusing said impurities in said first polysilicon film and said second polysilicon film at a temperature higher than that in said first heat-treatment step.

7. A fabrication method for a semiconductor device according to claim 6, wherein said second heat-treatment step is performed by rapid thermal annealing.

8. A fabrication method for a semiconductor device according to claim 5, wherein said heat treatment in said third step is performed by rapid thermal annealing.

* * * * *